(12) United States Patent  
Pan

(10) Patent No.: US 7,928,710 B2  
(45) Date of Patent: *Apr. 19, 2011

(54) VOLTAGE PROTECTION CIRCUIT FOR THIN OXIDE TRANSISTORS, AND MEMORY DEVICE AND PROCESSOR-BASED SYSTEM USING SAME

(75) Inventor: Dong Pan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/726,167

(22) Filed: Mar. 17, 2010

(65) Prior Publication Data

US 2010/0188921 A1   Jul. 29, 2010

Related U.S. Application Data

(63) Continuation of application No. 11/885,824, filed on Sep. 6, 2007, now Pat. No. 7,701,184.

(51) Int. Cl.
   *G05F 1/571* (2006.01)
   *H02H 9/04* (2006.01)
(52) U.S. Cl. ........... 323/276; 323/274; 361/18; 365/226
(58) Field of Classification Search .......... 323/273, 323/274, 275, 276, 277, 279, 280, 281; 361/18, 361/93.9; 700/297, 298; 365/226
See application file for complete search history.

(56) References Cited

U.S. PATENT DOCUMENTS

| | | | |
|---|---|---|---|
| 4,008,418 A | 2/1977 | Murphy | 361/18 |
| 6,281,667 B1 | 8/2001 | Matsumura | 323/274 |
| 6,388,433 B2 | 5/2002 | Marty | 323/284 |
| 6,452,766 B1 * | 9/2002 | Carper | 361/18 |
| 6,509,723 B2 | 1/2003 | Matsushita | 323/281 |
| 6,518,830 B2 | 2/2003 | Gariboldi et al. | 327/536 |
| 6,580,257 B2 | 6/2003 | Marty | 323/280 |
| 7,015,680 B2 | 3/2006 | Moraveji et al. | 323/274 |
| 7,173,405 B2 | 2/2007 | Bo et al. | 323/312 |
| 7,212,067 B2 | 5/2007 | Pasternak | 327/541 |
| 7,477,557 B2 | 1/2009 | Keeth et al. | 365/201 |
| 7,602,161 B2 * | 10/2009 | McLeod | 323/273 |
| 7,701,184 B2 * | 4/2010 | Pan | 323/276 |
| 7,751,157 B2 * | 7/2010 | Migliavacca | 361/18 |
| 2007/0053115 A1 | 3/2007 | Tain et al. | 361/18 |

OTHER PUBLICATIONS

Hook, et al., "*The Dependence of Channel Length on Channel Width in Narrow-Channel CMOS Devices for 0.35-0.13 μm Technologies*", IEEE Electron Device Letters, vol. 21, No. 2, Feb. 2000, pp. 85-87.

* cited by examiner

*Primary Examiner* — Gary L Laxton
(74) *Attorney, Agent, or Firm* — Dorsey & Whitney LLP

(57) ABSTRACT

Devices, reference voltage generators, systems and methods may include an embodiment of a voltage regulator output transistor using a thin gate insulator to provide a low output impedance despite having a semiconductor channel width that is relatively small. The output transistor is protected from damage by a clamping circuit provided to limit the gate-to-source voltage of the transistor such that damage to the output transistor should be reduced or prevented. One such clamping circuit includes a clamp transistor that receives a reference voltage at its gate. The magnitude of the reference voltage limits to voltage to which the gate of the transistor can be driven. A voltage reference circuit provides the reference voltage so that it compensates for process and temperature variations of the output transistor.

49 Claims, 5 Drawing Sheets

US 7,928,710 B2

VOLTAGE PROTECTION CIRCUIT FOR THIN OXIDE TRANSISTORS, AND MEMORY DEVICE AND PROCESSOR-BASED SYSTEM USING SAME

CROSS-REFERENCE TO RELATED APPLICATION

This application is a continuation of U.S. patent application Ser. No. 11/885,824, filed Sep. 6, 2007, U.S. Pat. No. 7,701,184, which claims foreign priority from PCT Application No. PCT/US2007/75721, filed Aug. 10, 2007. These applications are incorporated by reference herein in their entirety and for all purposes.

TECHNICAL FIELD

This invention relates generally to semiconductor drivers, and, more particularly, in one or more embodiments, to a circuit for protecting thin film transistors from being damaged by excessive drive voltages.

BACKGROUND OF THE INVENTION

Semiconductor devices, such as MOSFET transistors, are generally designed to have specific performance features. For example, MOSFET transistors used as output transistors for voltage regulators or MOSFET transistors used or in other high current applications should have a low output impedance. As a result, such transistors generally have a relatively large channel width to reduce the ON impedance of the transistors. Although a large channel width is effective in providing a low output impedance, a large channel width does impose certain disadvantages. A large channel width, for example, consumes a relatively large amount of area on a semiconductor die, thus increasing the cost of devices using such wide channel MOSFET transistors. A large channel width also results in a relatively large gate capacitance, which reduces the operating speed of such MOSFET transistors.

Another parameter that affects the design of MOSFET transistors is the voltage level with which they are capable of operating. For example, the gate-to-source voltage of a MOSFET transistor must be limited to a value that does not cause damage to an insulative layer between the gate and the channel. Such gate insulation is generally in the form of a layer of silicon dioxide, which can be damaged by excessive gate-to-source voltages. The gate-to-source voltage that a MOSFET transistor is capable of withstanding can be increased by increasing the thickness of the gate insulation. However, thicker layers of insulative material can adversely affect the performance of MOSFET transistors. For example, a thicker gate insulation layer reduces the driving ability and bias current of such transistors, and it requires an increase in the length of the channels. Yet, a large channel length again increases the size that MOSFET transistors consume on a semiconductor die.

There is therefore an inevitable trade-off between the size of MOSFET transistors and their ability to handle large currents and large drive voltages. A MOSFET having a relatively small length and width could be used if the thickness of the gate insulation layer could be reduced. But reducing the gate thickness limits the voltage with which such transistors can be used. As a result, it has heretofore been necessary for MOSFET transistors used as voltage regulator output transistors or in other applications handling a high current and a high voltage to be relatively large.

There is therefore a need for a MOSFET transistor that, for example, consumes a relatively small area, can provide good drive performance and a low gate capacitance, and can handle relatively high drive voltages.

DETAILED DESCRIPTION

Figure 1:
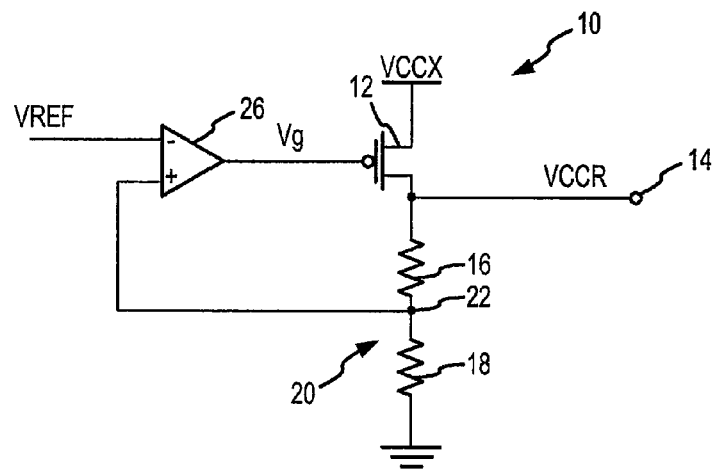
FIG. 1 is a schematic diagram of a prior art voltage regulator output driver.

An embodiment of a prior art voltage regulator output driver 10 is shown in FIG. 1. It will be understood, however, that the driver 10 may be used in devices other than voltage regulators. The output driver 10 includes a PMOS transistor 12 having a source connected to a supply voltage VCCX, which may be an externally-supplied, unregulated supply voltage. A drain of the transistor 12 is connected to an output terminal 14, which provides a regulated supply voltage VCCR. The drain of the transistor 12 is also connected to ground through a pair of resistors 16, 18, which form a voltage divider 20 having an output node 22. Thus, the voltage output by the voltage divider 20 is a fixed percentage of the voltage VCCR. The output node 22 is connected to the "+" input of a opamp 26, which receives a reference voltage VREF at its "−" input. The output of the opamp 26 is connected to a gate of the transistor 12 to adjust the gate voltage as a function of a comparison of the voltage from the voltage divider 20 and the output voltage VCCR. The gate voltage is therefore adjusted to maintain the output voltage VCCR at a preset voltage.

In operation, if the output voltage VCCR falls below the preset voltage, the voltage output by the voltage divider 20 correspondingly decreases. As a result, the voltage output by the-opamp 26 increases to decrease the gate-to-source voltage of the transistor 12. This decreased gate-to-source voltage causes the output voltage VCCR to decrease back to the preset voltage. Conversely, if the output voltage VCCR increases, the voltage output by the voltage divider 20 correspondingly increases. The opamp 26 then decreases to increase the gate-to-source voltage of the transistor 12 to causes the output voltage VCCR to increase back to the preset voltage.

Although the output driver 10 can adequately regulate a supply voltage, it suffers from a number of disadvantages. As explained above, insofar as the driver 10 is used as a voltage regulator, it may be required to supply a substantial current to circuitry (not shown) to which it is supplying the voltage VCCR. As a result, the transistor 12 must generally have a large channel width, which can consume a substantial amount of area of a semiconductor die. Additionally, the operating speed of the output driver 10, i.e., its ability to respond to rapid changes in the load driven by the transistor 12, may be unduly slow because of the relatively large gate capacitance resulting from the large channel width. While the channel width could be reduced by making the gate insulation of the transistor 12 thinner, doing so can over-stress the transistor if, for example, the opamp 26 is too slow to respond to changes in VCCR. For example, when the supply voltage VCCX is initially applied to the output driver 10, the voltage at the output of the opamp 26 may be at zero volts. As a result, the full magnitude of VCCX will be applied between the source and gate of the transistor 12 until the opamp 26 becomes operational. This high gate-to-source voltage can easily damage the transistor 12 if it has a thin gate insulation layer.

Figure 2:
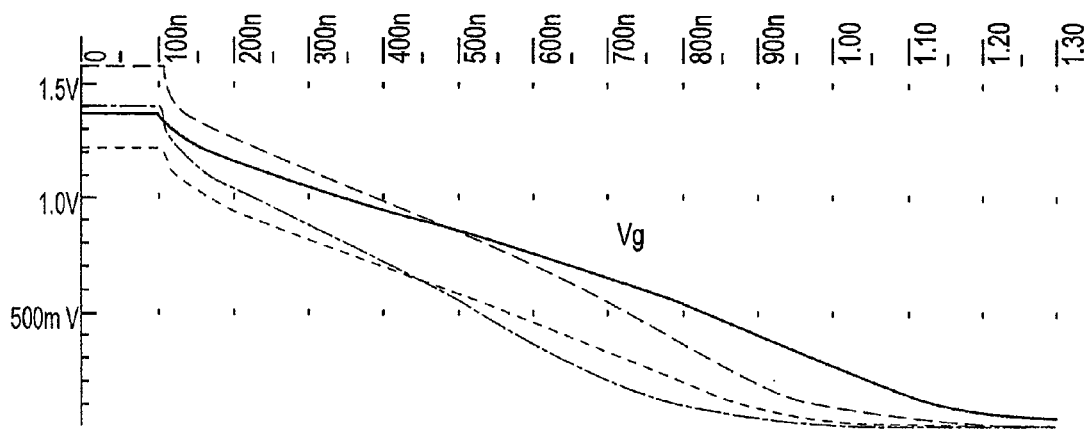
FIG. 2 is a graph showing the output transistor gate voltage in the output driver of FIG. 1 as the load driven by the output transistor increases.

Even if the output driver 10 can be designed to avoid over-stressing the transistor 12 on power-up, it can still be over-stressed during normal use as the load driven by the driver 10 increases, as shown in FIG. 2. FIG. 2 shows the magnitude of the gate voltage Vg with several values of process and temperature corners at a supply voltage VCCX equal to 2.0V. With reference to FIG. 2, for a "no load" condition, the gate voltage Vg will be equal to VCCX less the threshold voltage Vth, which is shown in FIG. 2 as being 1.4 volts. As the load increases, the gate voltage Vg will decrease to maintain the regulated voltage VCCR at the preset level. As the load continues to increase, the gate voltage Vg continues to decrease until it reaches 0 volts. At this point, the full magnitude of the supply voltage VCCX will be applied between the source and the gate of the transistor 12.

Figure 3:
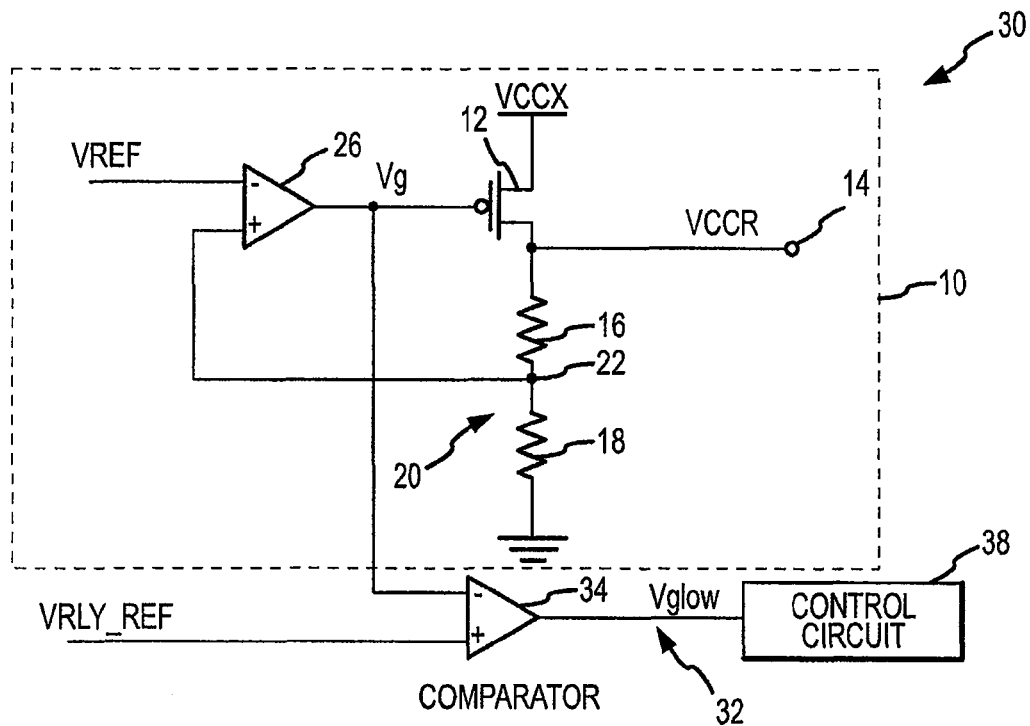
FIG. 3 is a schematic diagram of an embodiment of a voltage regulator output driver according to one embodiment of the invention.

A voltage regulator output driver 30 according to one embodiment of the invention is shown in FIG. 3. The output driver 30 uses the output driver 10 of FIG. 1, but includes a limiting circuit 32 for limiting the magnitude of the gate-to-source voltage of the transistor 12. Specifically, the limiting circuit 32 includes a second comparator 34 for comparing the gate voltage Vg to a reference voltage Vrly_ref. The output of the comparator 34 drives a control circuit 38 that affects the operation of the output driver 10 if the gate voltage Vg falls sufficiently below the reference voltage Vrly_ref, thereby causing the comparator 34 to output an increased voltage Vglow. For example, in response to an increased value Vglow, the control circuit 38 may drive the gate voltage Vg higher. Alternatively, the control circuit 38 may reduce the load on the output driver 30. Other means of keeping the gate voltage Vg at an acceptable level responsive to the voltage Vglow may also be used.

Although the output driver 30 shown in FIG. 3 is effective in preventing the gate-to-source voltage from increasing beyond a certain level, it is not without its limitations. One disadvantage is that the area of a semiconductor die occupied by the comparator 34 may undesirably increase the cost of devices using the output driver 30. Additionally, the comparator 34 will consume bias current, thereby increasing the power consumption of a device using the output driver 30. Minimizing the bias current may reduce the operating speed of the comparator 34 so it may fail to limit the gate-to-source voltage quickly enough to avoid damaging the output transistor 12. Finally, when the gate voltage Vg is too low, the comparators 26, 34 may counteract each other in an unstable manner so that the magnitude of the regulated output voltage VCCR may oscillate.

Figure 4:
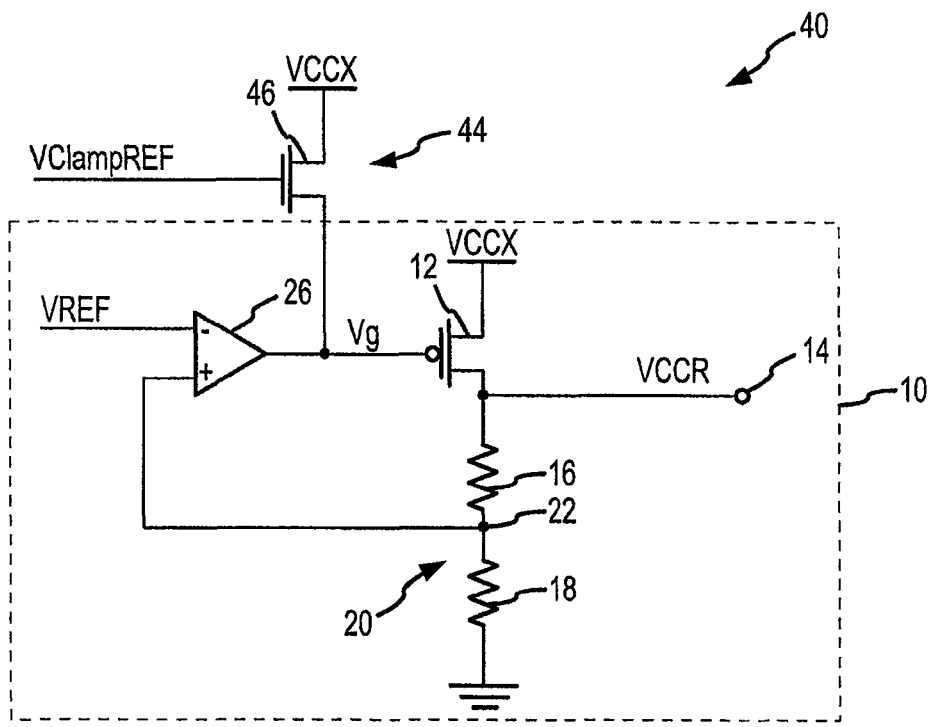
FIG. 4 is a schematic diagram of an embodiment of a voltage regulator output driver according to another embodiment of the invention.

An output driver 40 according to another embodiment of the invention that avoids the potential problems with the output driver 30 is shown in FIG. 4. The output driver 40 again uses the prior art output driver 10 shown in FIG. 1. However, the output driver 40 includes a clamp circuit 44 that limits the gate voltage Vg relative to the unregulated supply voltage VCCX. In the embodiment shown in FIG. 4, the clamp circuit 44 includes an NMOS clamp transistor 46 receiving the unregulated supply voltage VCCX at its drain and a reference voltage VClampREF at its gate. A source of the transistor 46 is connected to the gate of the transistor 12.

Figure 5:
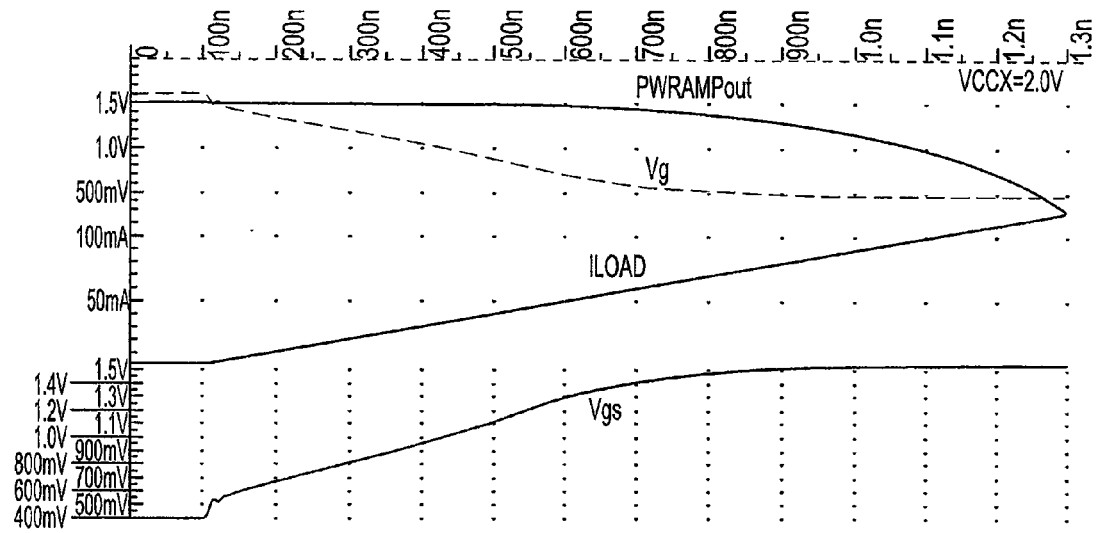
FIG. 5 is a simulation graph showing voltages present in the voltage regulator output driver of FIG. 4 as the load driven by the output driver increases.

In operation, the clamp transistor 46 remains non-conductive as long as the gate voltage Vg is greater than the supply voltage VCCX less the threshold voltage $V_{TH}(46)$ of the transistor 46. However, if the gate of the gate voltage Vg attempts to drop below that voltage, the transistor 46 starts to turn ON to supply current to the gate of the transistor 12 to prevent the gate voltage Vg from further decreasing. As a result, the minimum gate voltage Vgmin of the transistor 12 is VClampREF-$V_{TH}(46)$. In this manner, the gate-to-source voltage of the transistor 12 is limited to a level that avoids damaging the transistor 12, as shown in FIG. 5. FIG. 5 shows the magnitude of the gate voltage Vg with several values of process and temperature corners at a supply voltage VCCX equal to 2.0V. When the load increases, the gate voltage Vg decreases to maintain the regulated output voltage VCCR relatively constant. The decreasing gate voltage Vg causes the gate-to-source voltage Vgs to increase. When the gate voltage Vg reaches about 700 mv, corresponding to a gate-to-source voltage Vgs of about 1.3 v, the transistor 46 starts to turn ON to supply current to the gate of the transistor 12. As a result, as shown in FIG. 5, the gate voltage Vg is limited to about 0.5 volt, and the gate-to-source voltage Vgs is limited to about 1.5 volts. As a result, the transistor 12 is protected from being over-stressed even though the transistor 12 may use a gate insulation layer that is relatively thin. The thin gate insulation allow the channel width to be small, such as a channel width-to-length ratio of 5,000/1.6, thereby minimizing the size of the area consumed by the output driver 40 and the gate capacitance of the transistor 46.

The challenge to implementing the output driver 40 shown in FIG. 4 is providing a clamp reference voltage VClampREF that is correct despite process variations and variations in the temperature of the output driver 40. For example, if the VClampREF is held constant and the threshold voltage Vth of the clamp transistor 46 varies with process variations or temperature, the minimum gate voltage Vgmin of the output transistor 12 may vary accordingly. As a result, the gate-to-source voltage Vgs may become excessive, thereby damaging the transistor 12.

Figure 6:
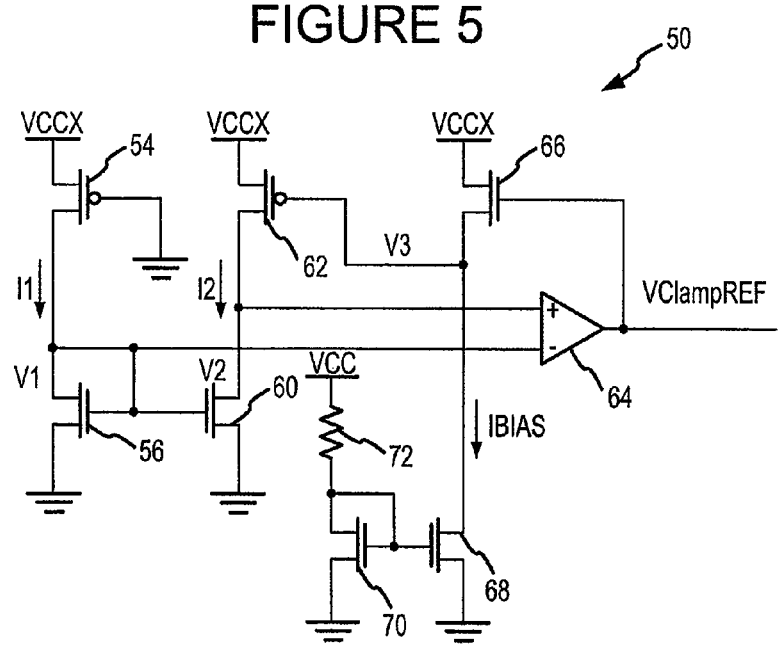
FIG. 6 is a schematic diagram of an embodiment of a voltage reference source that can be used to provide a reference voltage to the voltage regulator output driver of FIG. 4 or an output driver according to some other embodiment of the invention.

One embodiment of a reference voltage generator circuit 50 for providing the correct clamp reference voltage VclampREF is shown in FIG. 6. The circuit 50 includes several current paths, the first of which includes a PMOS transistor 54 coupled in series with an NMOS transistor 56 between a supply voltage VCC and ground. The PMOS transistor 54 is biased ON by ground potential being applied to its gate, and the NMOS transistor 56 is diode-connected to pass a current I1. The transistor 56 is connected as a current mirror with a second NMOS transistor 60 that is connected in series with a PMOS transistor 62 between the unregulated supply voltage VCCX and ground. The transistor 60 therefore conducts a current I2 that is equal to the current I1, and a voltage V2 at the drain of the transistor 60 is equal to a voltage V1 at the drain of the transistor 56. As a result, the gate-to-source voltage Vgs of the transistor 54 is equal to the gate-to-source voltage Vgs of the transistor 62, i.e., Vgs(54)=Vgs(62). Insofar as Vgs(54) =VCC and Vgs(62)=VCCX−V3. Therefore, VCC=VCCX− V3, which can be rewritten as:

$$V3 = VCCX - VCC \quad \text{[Equation 1]}.$$

The voltages V1 and V2 are applied to the inputs of a opamp 64, which generates the clamp reference voltage VClampREF at its output. The output of the opamp 64 is also applied to a gate of an NMOS transistor 66, which is connected in series with a second NMOS transistor 68 between VCCX and ground to conduct a bias current Ibias. The transistor 68, is, in turn, connected as a current mirror with an NMOS transistor 70 that is connected in series with a resistor 72 between VCC and ground. As a result, a bias current Ibias conducted by the transistor 68 is set by the resistor 72 and transistor 70. The feedback loop formed by the opamp 64 and transistors 66, 62 regulate VClampREF so that V3 accurately tracks the threshold voltage $V_{TH}(46)$ of the clamp transistor 46 as it varies responsive to process and temperature variations. For example, if the threshold voltages increase, then V3 will decrease, which will cause the PMOS transistor 62 to reduce V2. The opamp 64 will increase the magnitude VClampREF accordingly to maintain the transistors 46, 66 at the same operation point as prior to the increase in the threshold voltages.

The gate-to-source voltage Vgs(66) of an NMOS transistor 66 is equal to VClampREF−V3, so that:

$$VClampREF = Vgs(66) + V3 \quad \text{[Equation 2]}.$$

When the bias current Ibias is relatively small, the gate-to-source voltage Vgs(66) of the transistor 66 is substantially equal to the threshold voltage $V_{TH}(66)$ of the transistor 66. As a result:

$$VClampREF = V3 + V_{TH}(66) \quad \text{[Equation 3]}.$$

As shown by Equation 1, V3 is equal to VCCX−VCC. Therefore, combining Equation 1 with Equation 3 yields:

$$VClampREF = VCCX - VCC + V_{TH}(66) \quad \text{[Equation 4]}.$$

As also explained above, Vgmin of the transistor 12 is given by the equation:

$$Vgmin = VClampREF - V_{TH}(46). \quad \text{[Equation 5]}.$$

Therefore, combining Equation 5 with Equation 4 provides the equation for Vgmin as:

$$Vgmin = VCCX - VCC + V_{TH}(66) - V_{TH}(46) \quad \text{[Equation 6]}.$$

If the threshold voltage $V_{TH}(66)$ of the transistor 66 can be made equal to the threshold voltage $V_{TH}(46)$ of the clamp transistor 46, then Equation 6 can be reduced to:

$$Vgmin = VCCX - VCC \quad \text{[Equation 7]}.$$

As a result, the maximum gate-to-source voltage Vgs of the transistor 12 will be VCC. Therefore, the maximum gate-to-source voltage Vgs of the transistor 12 should be insensitive to process and temperature variations as well as to variations in the magnitude of the unregulated supply voltage VCCX.

Figure 7:
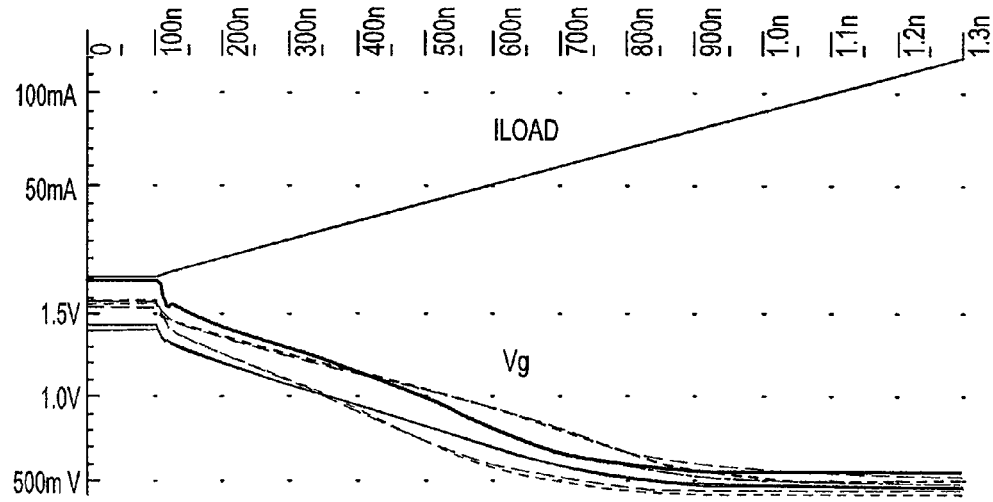
FIG. 7 is a simulation graph showing the output transistor gate voltage in the output driver of FIG. 4 as the load driven by the output transistor increases.

The operation performance of the output driver 40 using the reference voltage generator circuit 50 is shown in FIG. 7, which can be contrasted against the performance shown in FIG. 2 of the prior art output driver 10. FIG. 7 shows the magnitude of the gate voltage Vg with several values of process and temperature corners at a supply voltage VCCX equal to 2.0V. As shown in FIG. 7, the gate voltage Vg of the transistor 12 is limited to about 0.5 volt. As a result, the gate-to-source voltage Vgs of the transistor 12 is limited to about 1.5 volts. Moreover, the variations in the gate voltage Vg of the transistor 12 is relatively insensitive to process and temperature variations, as shown by the close spacing between the graphs shown in FIG. 7.

Figure 8:
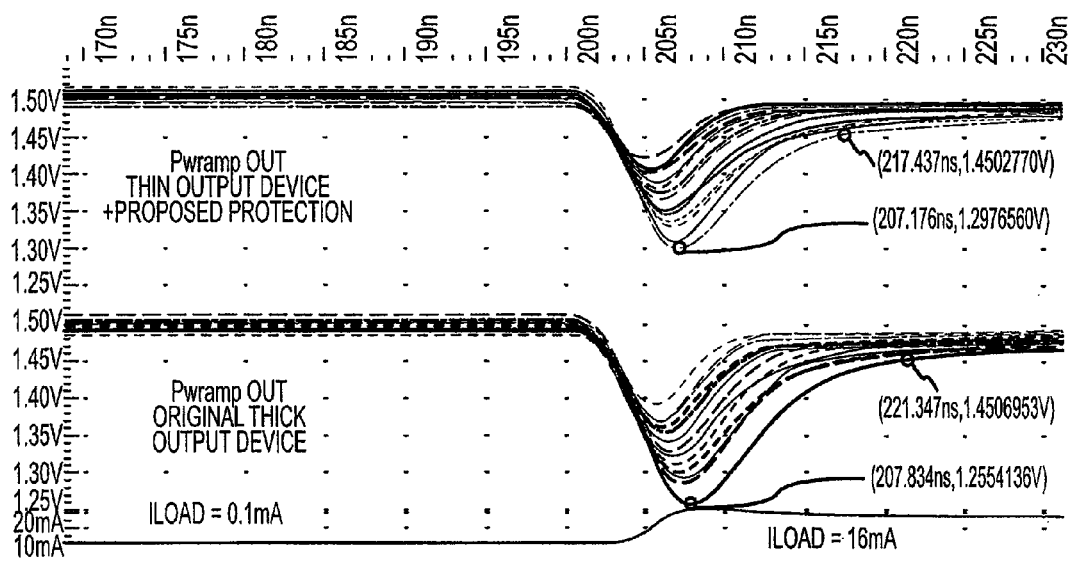
FIG. 8 is a simulation graph showing the operating performance of the voltage regulator output driver of FIG. 4 compared to the operating performance of the voltage regulator output driver of FIG. 1 responsive to an increased load.

The ability of the output driver 40 shown in FIG. 4 using the reference voltage generator circuit 50 is shown in FIG. 7 to regulate the output voltage VCCR compared to the prior art output driver 10 shown in FIG. 1 is illustrated in FIG. 8. FIG. 8 shows a substantial increase in load at about 200 ns, as shown in the bottom graph of FIG. 8. As shown in the next to the bottom graph of FIG. 8, the magnitude of the output voltage VCCR varies substantially in response to the load increase at each of several process and temperature variations shown in FIG. 8. In contrast, as shown by the upper graph in FIG. 8, the magnitude of the output voltage VCCR varies to a substantially smaller degree responsive to the load increase at the same process and temperature variations shown in FIG. 8. Therefore, the output driver 40 should provide superior performance by using the output transistor 46 having a thin gate insulation.

Figure 9:
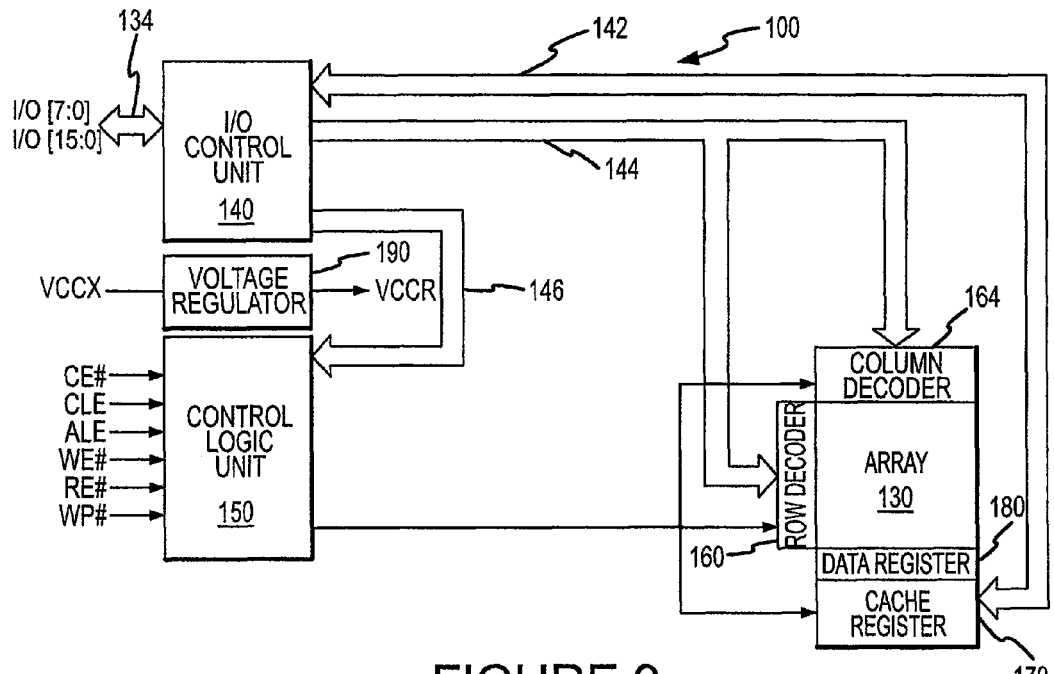
FIG. 9 is a block diagram of a memory device using the supply voltage regulator shown in FIG. 3 or 4 and 6, or a voltage regulator according to some other embodiment of the invention.

A flash memory device 100 that includes one or more of the supply voltage regulators shown in FIG. 3 or 4 and 6, or a voltage regulator according to some other embodiment of the invention, is shown in FIG. 9. Although a supply voltage regulator according to various embodiments of the invention is shown in FIG. 9 and explained in the context of the flash memory device 100, it should be understood that they can be used in other devices. Specifically, the supply voltage regulators shown in FIG. 3 or 4 and 6, or a voltage regulator according to some other embodiment of the invention, can be used in other types of integrated circuits such as dynamic random access memory devices or processors, to name just two. With reference to FIG. 9, the flash memory device 100 includes an array 130 of flash memory cells arranged in banks of rows and columns. Most command signals, the address signals and the write data signals are applied to the memory device 100 as sets of sequential input/output ("I/O") signals transmitted through an I/O bus 134. Similarly, read data signals are output from the flash memory device 100 through the I/O bus 134. The I/O bus is connected to an I/O control unit 140 that routes the signals between the I/O bus 134 and an internal data bus 142, an internal address bus 144, and an internal command bus 146. The flash memory device 100 also includes a control logic unit 150 that receives a number of control signals either externally or through the command bus 146 to control the operation of the memory device 100. The address bus 144 applies row address signals to a row decoder 160 and column address signals to a column decoder 164. Similarly, the column decoder 164 enables write data signals to be applied to bit lines for columns corresponding to the column address signals and allows read data signals to be coupled from bit lines for columns corresponding to the column address signals.

In response to the memory commands decoded by the control logic unit 150, the flash memory cells in the array 130 are erased, programmed, or read. The memory array 130 is programmed on a row-by-row or page-by-page basis. After the row address signals have been applied to the address bus 144, the I/O control unit 140 routes write data signals to a cache register 170. The write data signals are stored in the cache register 170 in successive sets each having a size corresponding to the width of the I/O bus 134. The cache register 170 sequentially stores the sets of write data signals for an entire row or page of flash memory cells in the array 130. All of the stored write data signals are then used to program a row or page of memory cells in the array 130 selected by the row address coupled through the address bus 144. In a similar manner, during a read operation, data signals from a row or page of memory cells selected by the row address coupled through the address bus 144 are stored in a data register 180. Sets of data signals corresponding in size to the width of the I/O bus 134 are then sequentially transferred through the I/O control unit 140 from the data register 180 to the I/O bus 134.

All of the components of the flash memory device 100 are powered by a voltage regulator 190, which may be the supply voltage regulator shown in FIG. 3 or 4 and 6, or a voltage regulator according to some other embodiment of the invention. As explained above, the voltage regulator 190 receives an external supply voltage, which may be unregulated, and it outputs a regulated supply voltage VCCR. The regulated voltage VCCR may be used to power all of the components of the memory device 100 or it may be used to power only some of the components, such as programming circuits that must impart a specific charge to memory cells in the array 130. Although the voltage regulator 190 is described herein in the context of a flash memory device, it will be understood that it may advantageously be used in other types of memory devices and in other types of integrated circuits other than memory devices.

Figure 10:
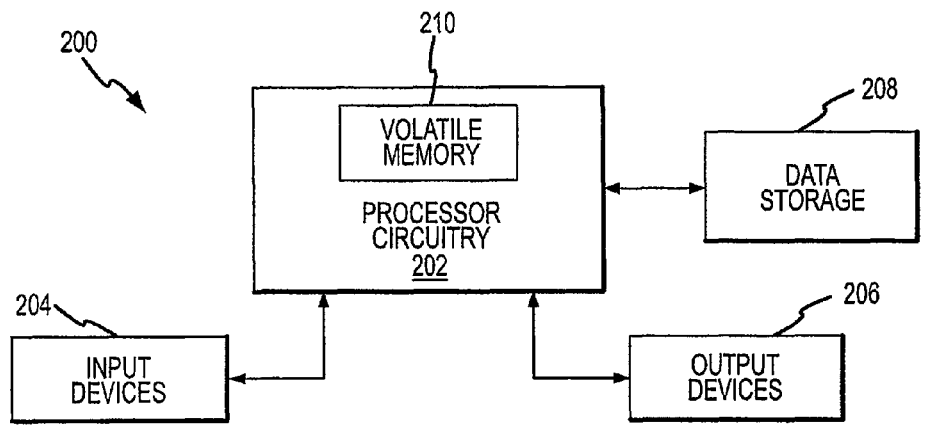
FIG. 10 is a block diagram of a processor-based system using the memory device of FIG. 9 or a memory device according to some other embodiment of the invention.

FIG. 10 is a block diagram of a processor-based system 200 including processor circuitry 202 having a volatile memory 210 of FIG. 9. The processor circuitry 202 is coupled through address, data, and control buses to the volatile memory 210 to provide for writing data to and reading data from the volatile memory 210. The processor circuitry 202 includes circuitry for performing various processing functions, such as executing specific software to perform specific calculations or tasks. The processor-based system 200 also includes one or more input devices 204 coupled to the processor circuitry 202 to allow an operator to interface with the processor-based system 200. Examples of input devices 204 include keypads, touch screens, and scroll wheels. The processor-based system 200 also includes one or more output devices 206 coupled to the processor circuitry 202 to provide output information to the operator. In one example, the output device 206 is a visual display providing visual information to the operator. Data storage 208 is also coupled to the processor circuitry 202 to store data that is to be retained even when power is not supplied to the processor-based system 200 or to the data storage 208. The flash memory device 100, or a flash memory device according to some other example of the invention, can be used for the data storage 208.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A voltage regulator device, comprising:
   a transistor having a gate coupled to receive a control voltage indicative of a magnitude of a voltage at one of a drain or a source of the transistor relative to a target voltage, the transistor having one of the source and the drain coupled to a supply voltage node; and
   a limiting circuit, comprising:
   a comparator having a first differential input coupled to the gate of the transistor and a second differential input coupled to a reference voltage node, the comparator being configured to provide a limiting control voltage corresponding to a comparison between the control voltage at the gate of the transistor and a reference voltage applied to the reference voltage node; and
   a control circuit having an input coupled to the output of the comparator, the control circuit being configured to control a magnitude of the control voltage applied to the gate of the transistor responsive to the limiting control voltage.

2. The voltage regulator device of claim 1 wherein the limiting circuit comprises a clamp circuit coupled to the gate of the transistor, the clamp circuit being configured to limit a voltage operating range of the control voltage applied to the gate of the transistor relative to an unregulated supply voltage.

3. The voltage regulator device of claim 2 wherein the clamp circuit comprises a clamp transistor having a drain coupled to receive the supply voltage, a gate coupled to receive a clamp reference voltage, and a source coupled to the gate of the transistor.

4. The voltage regulator device of claim 3, further comprising a reference voltage generator for providing the clamp reference voltage, the reference voltage generator, comprising:
   a reference comparator having a first differential input coupled to receive a first bias voltage, a second differential input, and an output on which the clamp reference voltage is generated; and
   a reference transistor having a threshold voltage that is configured to track a threshold voltage of the clamp transistor, the reference transistor having a gate coupled to the output of the comparator, a drain coupled to receive the supply voltage, and a source coupled to the second differential input of the comparator.

5. The voltage regulator device of claim 1 wherein the control circuit is configured to be responsive to the limiting control voltage to control the flow of current to or from the gate of the transistor.

6. The voltage regulator device of claim 1 wherein the limiting circuit is configured to reduce a magnitude of a load on the transistor responsive to the limiting control voltage.

7. The voltage regulator device of claim 1 wherein the limiting circuit is configured to increase the magnitude of the output voltage responsive to the limiting control voltage.

8. The voltage regulator device of claim 1 further comprising a comparator having a first differential input coupled to receive a reference voltage, a second differential input coupled to an output node of a voltage divider coupled to one of the drain or the source of the transistor, and an output coupled to the gate of the transistor.

9. The voltage regulator device of claim 1 wherein the transistor has a channel width-to-length ratio of less than or equal to 5,000/1.6.

10. A reference voltage generator operable to generate a reference voltage, comprising:
    a comparator having a first differential input coupled to receive a first bias voltage, a second differential input coupled to receive a second bias voltage, and an output on which the reference voltage is generated;
    a reference transistor having a threshold voltage that tracks a threshold voltage of a clamp transistor, the reference transistor having a gate coupled to the output of the comparator, one of a drain or a source coupled to receive a supply voltage, and the other of the source or the drain coupled to one of the first and second differential inputs of the comparator;

a first current path operable to generate the first bias voltage as a function of the current through the first current path, the first current path being coupled to the first differential input of the comparator to provide the first bias voltage to the first differential input; and a second current path operable to generate the second bias voltage as a function of the current through the second current path, the second current path being coupled to the second differential input of the comparator to provide the second bias voltage to the second differential input, the second current path being connected with the first current path as a current mirror so that the magnitude of the current through the first current path is substantially the same as the current through the second current path.

11. The reference voltage generator of claim 10 wherein the other of the source or the drain of the reference transistor is coupled to one of the first and second differential inputs of the comparator through a second transistor forming at least a part of one of the first and second current paths.

12. The reference voltage generator of claim 10, further comprising:
a first transistor diode-connected to a first supply voltage;
a second transistor connected in series with the first transistor between a second supply voltage and the first supply voltage, a junction between the first and second transistors being connected to the first differential input of the comparator;
a third transistor diode-connected to the first supply voltage; and
a fourth transistor connected in series with the third transistor between the second supply voltage and the first supply voltage, a junction between the third and fourth transistors being connected to the second differential input of the comparator.

13. The reference voltage generator of claim 12 wherein the second and fourth transistors are connected to each other as a current mirror.

14. A memory device comprising:
an array of memory cells; and
a voltage regulator device coupled to a supply voltage node, the voltage regulator being device being configured to supply a regulated output voltage to at least some components in the memory device, the voltage regulator device comprising:
a transistor having a gate coupled to receive a control voltage indicative of a magnitude of a voltage at one of a drain or a source of the transistor relative to a target voltage, the transistor having one of the source and the drain coupled to a supply voltage node; and
a limiting circuit, comprising:
a comparator having a first differential input coupled to the gate of the transistor and a second differential input coupled to a reference voltage node, the comparator being configured to provide a limiting control voltage corresponding to a comparison between the control voltage at the gate of the transistor and a reference voltage applied to the reference voltage node; and
a control circuit having an input coupled to the output of the comparator, the control circuit being configured to control a magnitude of the control voltage applied to the gate of the transistor responsive to the limiting control voltage.

15. The memory device of claim 14 wherein the limiting circuit comprises a clamp circuit coupled to the gate of the transistor, the clamp circuit being configured to limit a voltage operating range of the control voltage applied to the gate of the transistor relative to an unregulated supply voltage.

16. The memory device of claim 15 wherein the clamp circuit comprises a clamp transistor having a drain coupled to receive the supply voltage, a gate coupled to receive a clamp reference voltage, and a source coupled to the gate of the transistor.

17. The memory device of claim 16, further comprising a reference voltage generator for providing the clamp reference voltage, the reference voltage generator, comprising:
a reference comparator having a first differential input coupled to receive a first bias voltage, a second differential input, and an output on which the clamp reference voltage is generated; and
a reference transistor having a threshold voltage that is configured to track a threshold voltage of the clamp transistor, the reference transistor having a gate coupled to the output of the comparator, a drain coupled to receive the supply voltage, and a source coupled to the second differential input of the comparator.

18. The memory device of claim 14 wherein the control circuit is configured to be responsive to the limiting control voltage to control the flow of current to or from the gate of the transistor.

19. The memory device of claim 14 wherein the limiting circuit is configured to reduce a magnitude of a load on the transistor responsive to the limiting control voltage.

20. The memory device of claim 14 wherein the limiting circuit is configured to increase the magnitude of the output voltage responsive to the limiting control voltage.

21. The memory device of claim 14 further comprising a comparator having a first differential input coupled to receive a reference voltage, a second differential input coupled to an output node of a voltage divider coupled to one of the drain or the source of the transistor, and an output coupled to the gate of the transistor.

22. The memory device of claim 14 wherein the transistor has a channel width-to-length ratio of less than or equal to 5,000/1.6.

23. The memory device of claim 14 wherein the memory device comprises a dynamic random access memory device.

24. A voltage regulator device, comprising:
a transistor having a gate coupled to receive a control voltage and one of the source and the drain coupled to receive a supply voltage; and
a limiting circuit, comprising:
a clamp circuit coupled to the gate of the transistor, the clamp circuit being configured to limit a voltage operating range of the control voltage of the transistor relative to the supply voltage, the clamp circuit including a clamp transistor having a drain coupled to receive the supply voltage, a gate coupled to receive a reference voltage, and a source coupled to the gate of the transistor; and
a reference voltage generator for providing the reference voltage, the reference voltage generator, comprising:
a comparator having a first differential input; and
a reference transistor having a threshold voltage that tracks a threshold voltage of the clamp transistor, the reference transistor having a gate coupled to the output of the comparator, a drain coupled to receive the supply voltage, and a source coupled to the first differential input of the comparator.

25. The voltage regulator device of claim 24 further comprising a comparator having a first differential input coupled to receive the reference voltage, a second differential input coupled to an output node of a voltage divider coupled to one of the drain or the source of the transistor, and an output coupled to the gate of the transistor.

26. The voltage regulator device of claim 24 wherein the limiting circuit is operable to reduce a magnitude of a load on the transistor.

27. The voltage regulator device of claim 24 wherein the limiting circuit is operable to increase the magnitude of the output voltage.

28. A memory device comprising:
an array of memory cells; and
a voltage regulator, comprising:
  a transistor having a gate coupled to receive a control voltage and one of the source and the drain coupled to receive a supply voltage; and
  a limiting circuit, comprising:
    a clamp circuit coupled to the gate of the transistor, the clamp circuit being configured to limit a voltage operating range of the control voltage of the transistor relative to the supply voltage, the clamp circuit including a clamp transistor having a drain coupled to receive the supply voltage, a gate coupled to receive a reference voltage, and a source coupled to the gate of the transistor; and
    a reference voltage generator for providing the reference voltage, the reference voltage generator, comprising:
      a comparator having a first differential input; and
      a reference transistor having a threshold voltage that tracks a threshold voltage of the clamp transistor, the reference transistor having a gate coupled to the output of the comparator, a drain coupled to receive the supply voltage, and a source coupled to the first differential input of the comparator.

29. The memory device of claim 28 further comprising a comparator having a first differential input coupled to receive the reference voltage, a second differential input coupled to an output node of a voltage divider coupled to one of the drain or the source of the transistor, and an output coupled to the gate of the transistor.

30. The memory device of claim 28 wherein the limiting circuit is operable to reduce a magnitude of a load on the transistor.

31. The memory device of claim 28 wherein the limiting circuit is operable to increase the magnitude of the output voltage.

32. An output signal driver, comprising:
a transistor having a gate coupled to receive a control voltage indicative of a magnitude of a voltage at one of a drain or a source of the transistor relative to an input signal, the transistor having one of the source and the drain coupled to a supply voltage node; and
a limiting circuit, comprising:
  a comparator having a first differential input coupled to the gate of the transistor and a second differential input coupled to a reference voltage node, the comparator being configured to provide a limiting control voltage corresponding to a comparison between the control voltage at the gate of the transistor and a reference voltage applied to the reference voltage node; and
  a control circuit having an input coupled to the output of the comparator, the control circuit being configured to control a magnitude of the control voltage applied to the gate of the transistor responsive to the limiting control voltage.

33. The output signal driver of claim 32 wherein the limiting circuit comprises a clamp circuit coupled to the gate of the transistor, the clamp circuit being configured to limit a voltage operating range of the control voltage applied to the gate of the transistor relative to an unregulated supply voltage.

34. The output signal driver of claim 33 wherein the clamp circuit comprises a clamp transistor having a drain coupled to receive the supply voltage, a gate coupled to receive a clamp reference voltage, and a source coupled to the gate of the transistor.

35. The output signal driver of claim 32 wherein the control circuit is configured to be responsive to the limiting control voltage to control the flow of current to or from the gate of the transistor.

36. The output signal driver of claim 32 wherein the limiting circuit is configured to reduce a magnitude of a load on the transistor responsive to the limiting control voltage.

37. The output signal driver of claim 32 wherein the limiting circuit is configured to increase the magnitude of the output voltage responsive to the limiting control voltage.

38. The output signal driver of claim 32 further comprising a comparator having a first differential input coupled to receive a reference voltage, a second differential input coupled to an output node of a voltage divider coupled to one of the drain or the source of the transistor, and an output coupled to the gate of the transistor.

39. An output signal driver configured to provide an output signal corresponding to an input signal, comprising:
an output transistor having a source coupled to a supply voltage node, a gate coupled to receive the input signal, and a drain on which the output signal is generated;
a clamp transistor having one of a source and a drain coupled to the supply voltage node. the other of the source and a drain coupled to the gate of the output transistor, and a gate;
a comparator having a first differential input coupled to receive a first bias voltage, a second differential input coupled to receive a second bias voltage, and an output coupled to the gate of the output transistor;
a reference transistor having a threshold voltage that tracks a threshold voltage of the clamp transistor, the reference transistor having a gate coupled to the output of the comparator, one of a drain or a source coupled to the supply voltage node, and the other of the source or the drain coupled to one of the first and second differential inputs of the comparator;
a first current path operable to generate the first bias voltage as a function of the current through the first current path, the first current path being coupled to the first differential input of the comparator to provide the first bias voltage to the first differential input; and
a second current path operable to generate the second bias voltage as a function of the current through the second current path, the second current path being coupled to the second differential input of the comparator to provide the second bias voltage to the second differential input, the second current path being connected with the first current path as a current mirror so that the magnitude of the current through the first current path is substantially the same as the current through the second current path.

40. The output signal driver of claim 39 wherein the other of the source or the drain of the reference transistor is coupled to one of the first and second differential inputs of the comparator through a second transistor forming at least a part of one of the first and second current paths.

41. The output signal driver of claim 39 wherein the supply voltage node comprises a first supply voltage node, and wherein the output signal driver further comprises:
   a first transistor diode-connected to the first supply voltage node;
   a second transistor connected in series with the first transistor between the first supply voltage node and a second supply voltage node, a junction between the first and second transistors being connected to the first differential input of the comparator;
   a third transistor diode-connected to the first supply voltage node; and
   a fourth transistor connected in series with the third transistor between the second supply voltage node and the first supply voltage node, a junction between the third and fourth transistors being connected to the second differential input of the comparator.

42. The output signal driver of claim 41 wherein the second and fourth transistors are connected to each other as a current mirror.

43. A voltage regulator device, comprising:
   an output transistor having a gate coupled to receive a control voltage indicative of a magnitude of a voltage at one of a drain or a source of the transistor relative to a target voltage, the transistor having one of the source and the drain coupled to a supply voltage node; and
   a limiting circuit, comprising:
      a current clamp transistor having a drain coupled to a respective supply voltage node, a source coupled to the gate of the output transistor, and a gate;
      a comparator having first and second differential inputs, and an output coupled to the gate of the current clamp transistor;
      a first current path coupled to the first differential input of the comparator, the first current path including a current path transistor;
      a second current path coupled to the second differential input of the comparator; and
      a reference transistor having a threshold voltage that tracks a threshold voltage of the clamp transistor, the reference transistor having a gate coupled to the output of the comparator, one of a drain or a source coupled to a respective supply voltage node, and the other of the source or the drain coupled to a gate of the current path transistor.

44. The voltage regulator device of claim 43 wherein the first current path includes a second current path transistor coupled in series with the first current path transistor, and wherein the second current path includes a third current path transistor that is coupled to one of the first and second current path transistors as a current mirror.

45. The voltage regulator device of claim 43, further comprising a second comparator having a first differential input coupled to a reference voltage node, a second differential input coupled to the one of a drain or a source of the output transistor, and an output coupled to the gate of the output transistor.

46. A circuit, comprising:
   an output transistor having one of a source and a drain coupled to a supply voltage node, the other of the source and the drain coupled to an output node, and a gate; and
   a clamp transistor having a gate coupled to receive a limiting control voltage and a source coupled to the gate of the output transistor to apply a clamp voltage to the gate of the output transistor, the clamp transistor being configured to adjust the magnitude of the clamp voltage as a function of a threshold voltage of the output transistor.

47. The circuit of claim 46 wherein the clamp transistor comprises a transistor that has substantially the same threshold voltage as the threshold voltage of the output transistor.

48. The circuit of claim 46 wherein the clamp transistor has a drain coupled to a respective supply voltage node.

49. The circuit of claim 46, further comprising a comparator having a first differential input coupled to an input signal node, a second differential input coupled to the output node of the output transistor, and an output coupled to the gate of the output transistor.

\* \* \* \* \*

UNITED STATES PATENT AND TRADEMARK OFFICE
CERTIFICATE OF CORRECTION

| | |
|---|---|
| PATENT NO. | : 7,928,710 B2 |
| APPLICATION NO. | : 12/726167 |
| DATED | : April 19, 2011 |
| INVENTOR(S) | : Dong Pan |

It is certified that error appears in the above-identified patent and that said Letters Patent is hereby corrected as shown below:

In column 9, line 45, in Claim 14, after "regulator" delete "being".

In column 12, line 37, in Claim 39, delete "node." and insert -- node, --, therefor.

Signed and Sealed this
Fourteenth Day of June, 2011

David J. Kappos
*Director of the United States Patent and Trademark Office*